United States Patent
Harafuji et al.

(10) Patent No.: US 6,544,869 B1
(45) Date of Patent: Apr. 8, 2003

(54) METHOD AND APPARATUS FOR DEPOSITING SEMICONDUCTOR FILM AND METHOD FOR FABRICATING SEMICONDUCTOR DEVICE

(75) Inventors: Kenji Harafuji, Hirakata (JP); Akihiko Ishibashi, Sakai (JP); Yuzaburo Ban, Hirakata (JP); Kiyoshi Ohnaka, Sakai (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/884,133

(22) Filed: Jun. 20, 2001

(30) Foreign Application Priority Data

Jun. 23, 2000 (JP) ........................... 2000-188903

(51) Int. Cl.⁷ .............................................. H01L 21/20
(52) U.S. Cl. ........................ 438/492; 438/478; 438/483
(58) Field of Search ................. 438/478, 483, 438/492, 493

(56) References Cited

U.S. PATENT DOCUMENTS 4,935,383 A * 6/1990 Nouhi et al. ................. 117/104
6,190,457 B1 * 2/2001 Arai et al. ................... 118/725

FOREIGN PATENT DOCUMENTS

| EP | 482648 | * | 4/1992 |
| EP | 533129 | * | 3/1993 |
| EP | 837495 | * | 4/1998 |

OTHER PUBLICATIONS

C. Goodings et al., "A New Inlet Area Design For Horizontal Movpe Reactors", Journal of Crystal Growth 96, pp. 13–18, 1989.

Gerald B. Stringfellow, "Organometallic Vapor–Phase Epitaxy: Theory and Practice", Second Edition, Academic Press, pp. 364–365, Jul. 1, 1999.

* cited by examiner

Primary Examiner—Trung Dang
(74) Attorney, Agent, or Firm—Nixon Peabody LLP; Donald R. Studebaker

(57) ABSTRACT

A method for depositing a semiconductor film on a wafer by making a source gas supplied flow almost horizontally to the surface of the wafer. When a process condition, e.g., the flow velocity or pressure of the source gas, should be changed, the source gas has its velocity and/or pressure changed so that the source gas is supplied at a substantially constant flow rate.

8 Claims, 9 Drawing Sheets

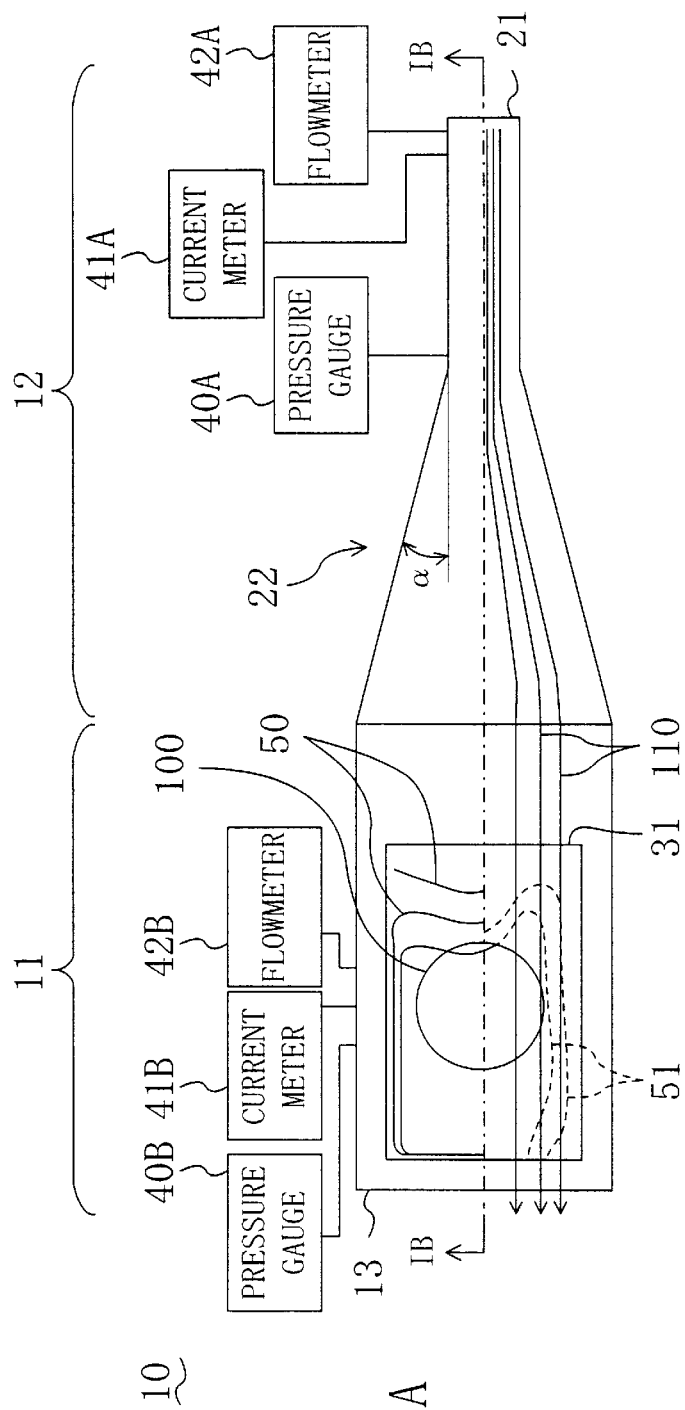
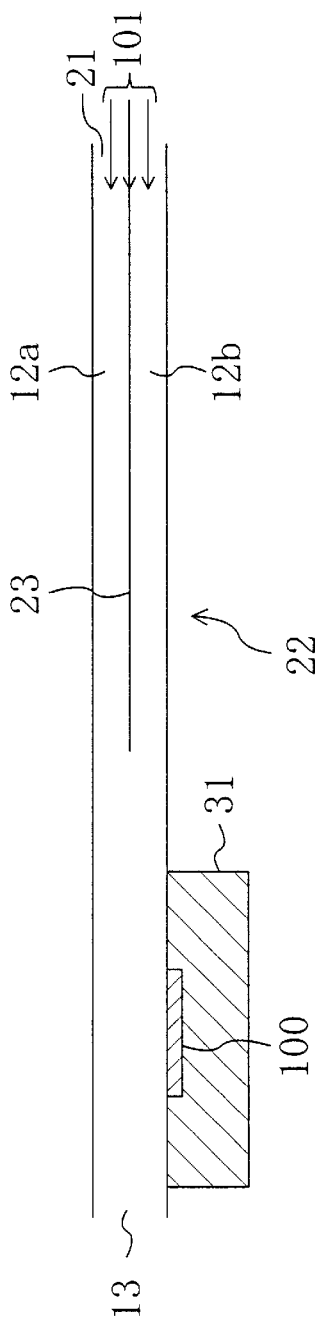
FIG. 1A
FIG. 1B

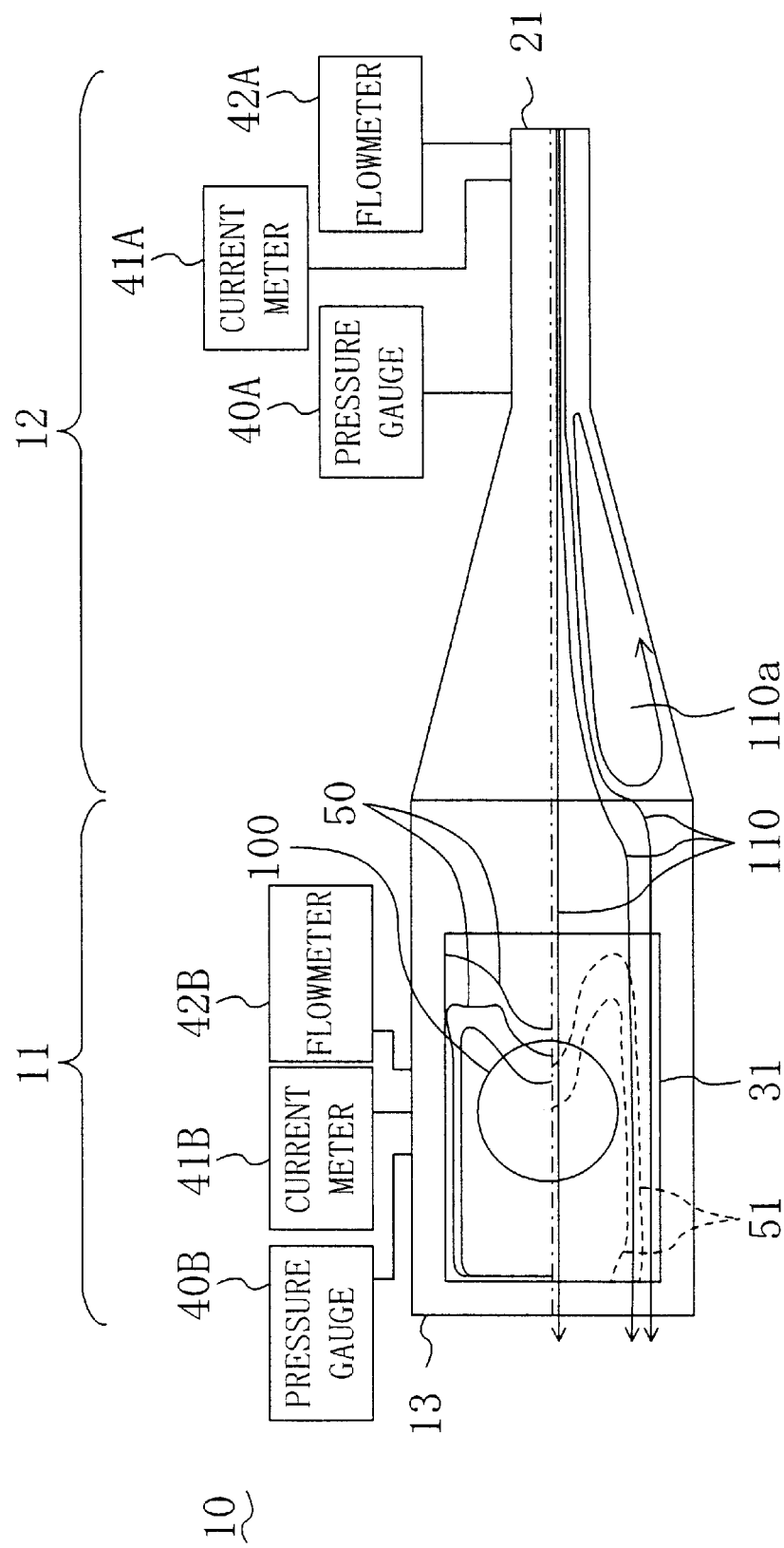

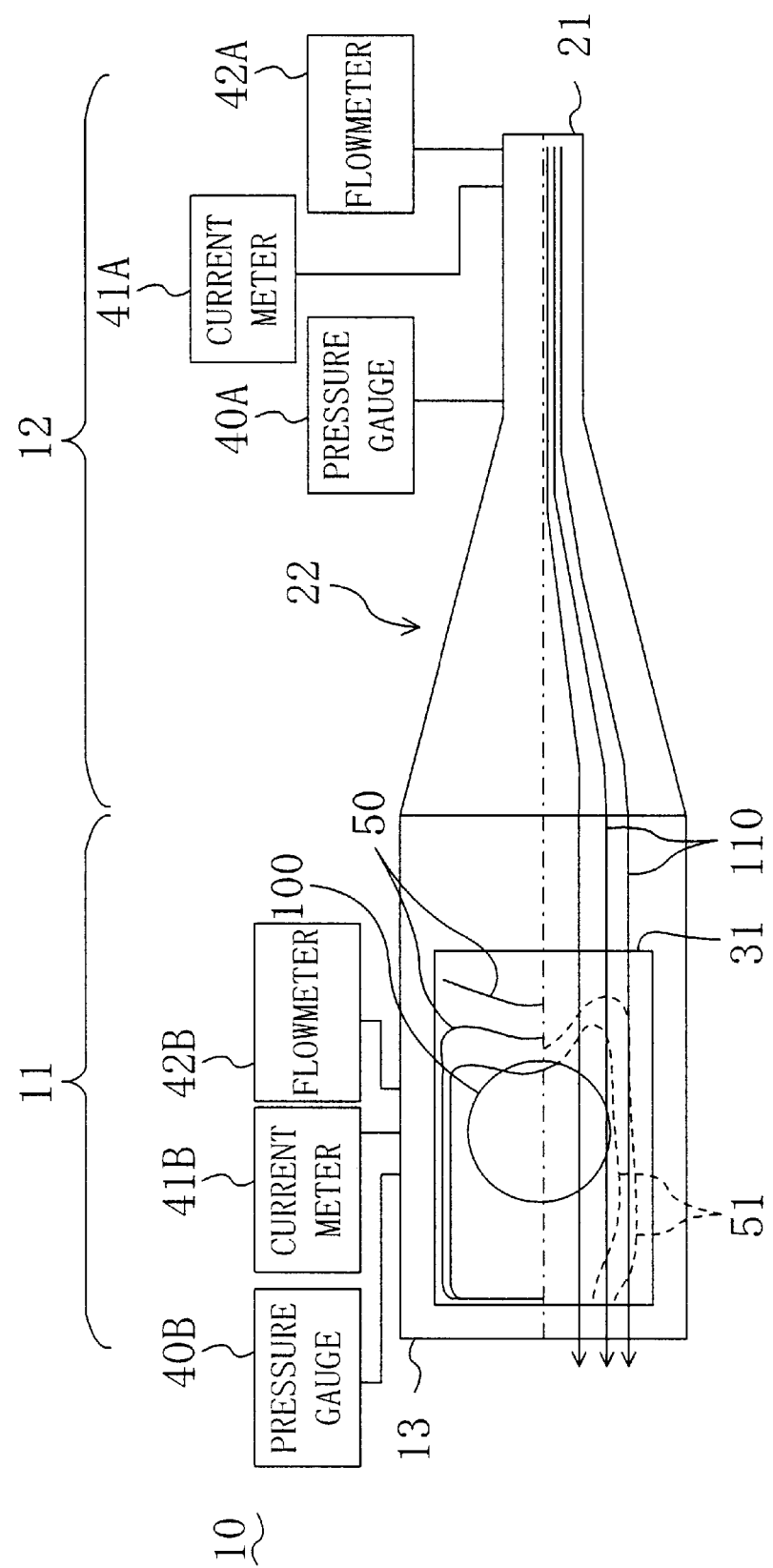

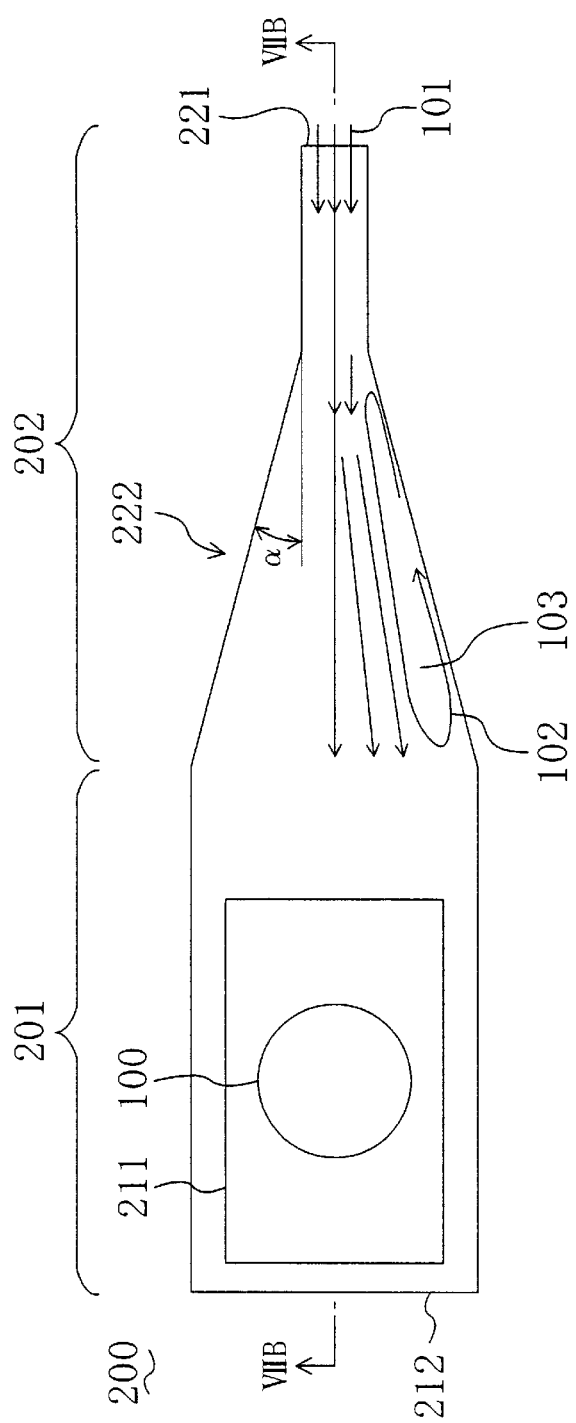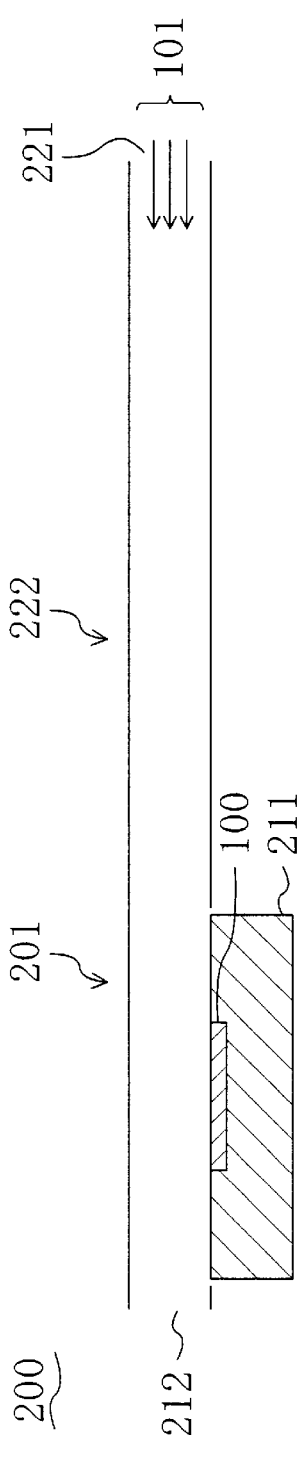
FIG. 7A
FIG. 7B

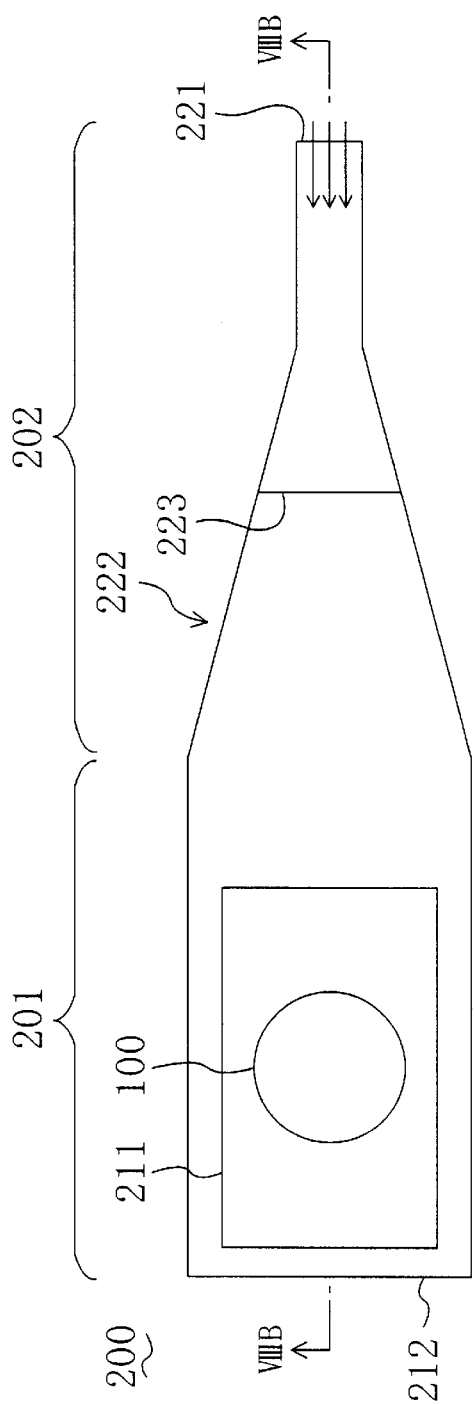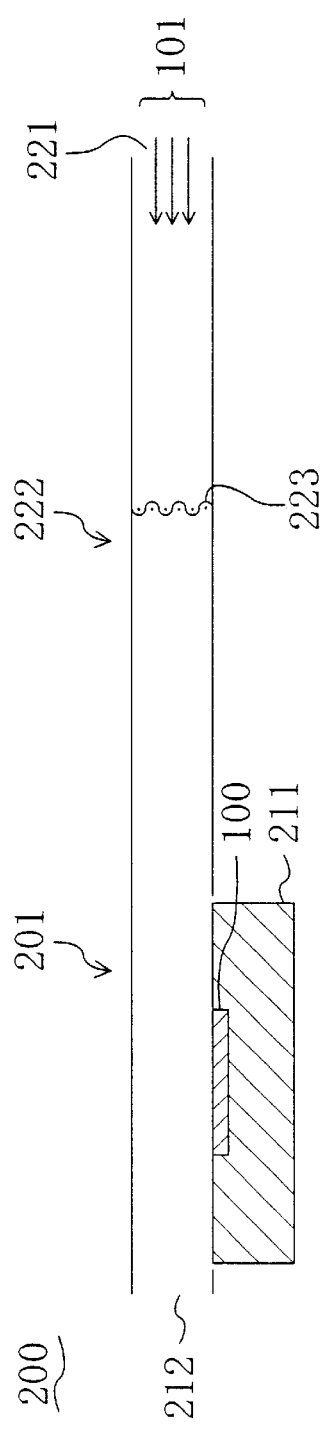
FIG. 8A
FIG. 8B

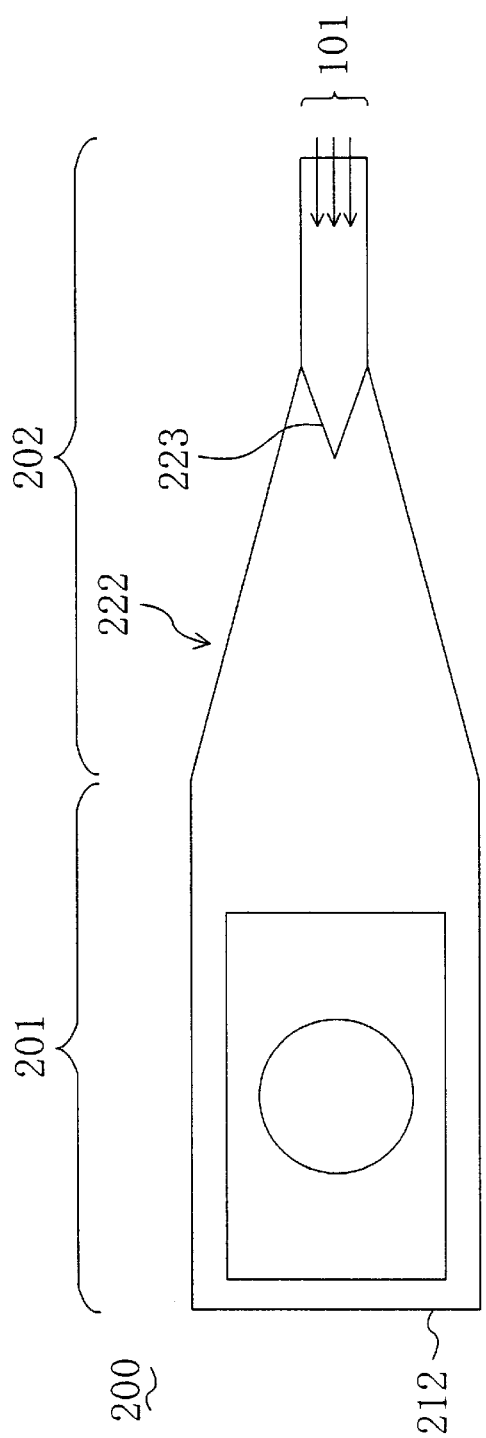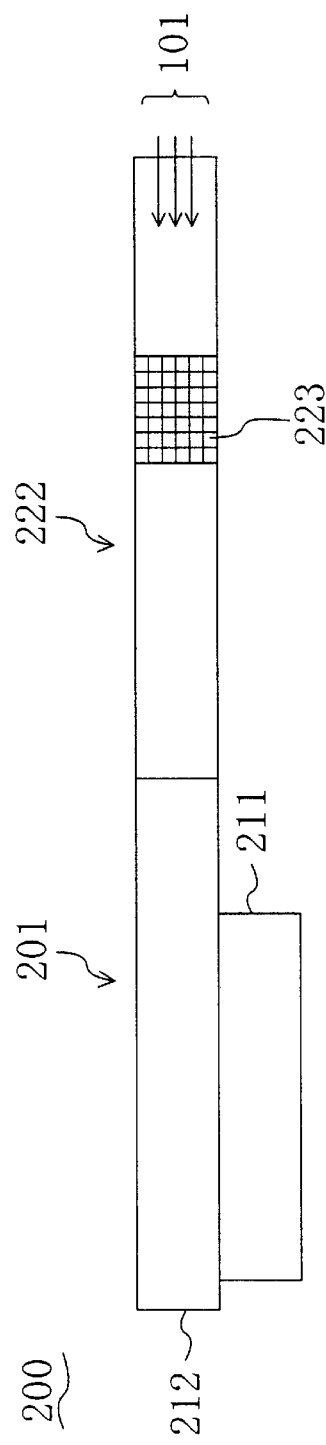
FIG. 9A
FIG. 9B

METHOD AND APPARATUS FOR DEPOSITING SEMICONDUCTOR FILM AND METHOD FOR FABRICATING SEMICONDUCTOR DEVICE

BACKGROUND OF THE INVENTION

The present invention relates to a method and apparatus for depositing a semiconductor film on a wafer by making source gases supplied flow almost horizontally to the surface of the wafer. The present invention also relates to a method for fabricating a semiconductor device by using the film deposition method or apparatus.

Group II-VI or III-V compound semiconductors are direct transition type semiconductors with wide bandgap energy, and are hopefully applicable to emitting light at various wave-lengths that range from visible through ultraviolet regions of the spectrum.

Among other things, Group III-V nitride semiconductors, including gallium (Ga) or aluminum (Al) as a Group III constituent and nitrogen (N) as a Group V constituent, have attracted much attention, because those semiconductors exhibit crystallographically excellent properties. Thus, a method for depositing a film of a nitride semiconductor just as intended is in high demand.

A metalorganic chemical vapor deposition (MOCVD) process has been researched and developed widely and vigorously as one of industrially implementable methods of promise.

Hereinafter, a so-called "horizontal MOCVD reactor", which is so constructed as to make source gases flow horizontally to the wafer surface, will be described as a known semiconductor film deposition apparatus with reference to FIGS. 7A and 7B.

As shown in FIGS. 7A and 7B, the horizontal reactor 200 includes: reactor body 201; gas inlet tube 202 with a gas inlet port 221; and susceptor 211 attached to the bottom of the reactor body 201. In this case, the reactor body 201 and gas inlet tube 202 are made of quartz glass, for example. Also, a gas outlet port 212 is provided at the other end of the reactor body 201 on the opposite side to the gas inlet tube 202.

The susceptor 211 holds a wafer 100 thereon to heat the wafer 100 up to a predetermined temperature.

A source gas 101, supplied through the gas inlet port 221, should be a laminar flow with no vortices after the gas 101 enters the tube 202 through the inlet port 221 and until the gas 101 reaches the space over the susceptor 211. The gas 101 also needs to flow in such a manner as to show spatially uniform velocity distribution over the wafer 100 to grow compound semiconductor crystals of quality.

However, the opening width of the gas inlet port 221 is relatively small as defined by its manufacturing standard, and the gas, supplied through the inlet port 221, should expand to cover an area equal to or greater in width than that of the susceptor 211. For that purpose, the gas inlet tube 202 has an expanded portion 222, the width of which gradually increases from the gas inlet port 221 toward the susceptor 211. In this case, if the angle $\alpha$ of expansion of the expanded portion 222 is large, then a streamline, which has flowed along the inner wall surface of the tube 202, separates from the surface in a velocity boundary layer near the wall of the expanded portion 222 as shown in FIG. 7A. Then, the streamline flows backward, i.e., toward the gas inlet port 221, to turn into a separated streamline (or vortex streamline) 102. Also, a wake, or a vortex 103, is created inside a curvature formed by the separated streamline 102. In other words, a backward flow, moving upstream along the wall surface of the expanded portion 222, is created and then separated from the wall surface at a separation point to form the separated streamline 102. In FIG. 7A, only the streamlines flowing along the wall on the left-hand side of the gas flow are illustrated. Actually, though, similar streamlines also flow along the right-hand-side wall surface almost symmetrically to the illustrated ones about the centerline.

If the vortex 103 is created in the expanded portion 222, then the channel width of the gas flow is substantially decreased or deformed. As a result, the velocity distribution of the gas flow over the susceptor 211 cannot be spatially uniform anymore. In addition, the source gas 101 gets partially stuck inside the vortex 103, thus adversely delaying the exchange of one source gas for another. In that case, even if the semiconductor film being deposited should have its composition changed, the interfacial profile cannot be steep enough.

To solve these problems, G. B. Stringfellow proposed expanding the sidewalls of the expanded portion 222 gently by setting the expansion angle $\alpha$ to 7 degrees or less (see "Organometallic Vapor-Phase Epitaxy", Second Edition, p. 364, Academic Press).

Another solution is disposing a netlike or porous diffuser 223 in the expanded portion 222 of the gas inlet tube 202 as shown in FIGS. 8A and 8B or 9A and 9B to prevent the vortex from being created in the expanded portion 222.

However, the known horizontal reactor 200 has the following drawbacks. Specifically, if the expansion angle $\alpha$ of the expanded portion 222 is set to about 7 degrees or less, then the distance from the gas inlet port 221 to the gas outlet port 212 of that reactor 200 becomes very long. Accordingly, it may take an excessively large area to dispose such a bulky reactor. Or that long reactor may break very easily, so too much care should be taken in handling such a reactor.

On the other hand, if the diffuser 223 is disposed inside the gas inlet tube 202, then the spatial uniformity in the velocity distribution of the gas flow improves. Nevertheless, the gas flow is reflected by the diffuser 223 to create another type of vortex, thus also delaying the exchange of one source gas for another.

In addition, if the horizontal reactor 200 should be re-designed every time some process condition, e.g., the flow velocity or pressure of a source gas, is changed and optimized, then the productivity should decline or the costs would increase disadvantageously.

SUMMARY OF THE INVENTION

It is therefore an object of the present invention to save the need for re-designing a horizontal reactor even if some condition, like the flow velocity or pressure of a source gas, for a film deposition process to be carried in the reactor has been changed and optimized.

To achieve this object, in depositing a semiconductor film, a gas flow rate is fixed at a predetermined value according to the present invention by keeping the product of the flow velocity and pressure of source gases inside the reactor constant.

The present inventors carried out various types of research on a process for depositing a compound semiconductor film using a horizontal reactor. As a result, we found that the spatial distributions of velocity and temperature of source gases and that of the thickness of a film to be deposited on a wafer are substantially controllable in the reactor by the flow rates of the source gases. The velocity and temperature distributions of reactant gases, resulting from chemical reaction between the source gases, were also controllable by the flow rates. As is well known in the art, the flow rate of a gas is proportional to the product of the flow velocity and pressure of the gas. Accordingly, each of those spatial distributions can be kept substantially uniform during the film deposition process only if the flow velocity or pressure of the source gases is changed in such a manner as to maintain a predetermined gas flow rate.

Specifically, a first inventive film deposition method is for use to deposit a semiconductor film on a wafer by making a source gas supplied flow almost horizontally to the surface of the wafer. In this method, the source gas has its flow velocity and/or pressure changed so that the source gas is supplied at a substantially constant flow rate.

According to the first inventive method, a source gas supplied has its flow velocity near its inlet port and pressure inside a reactor changed so that the source gas is supplied onto a wafer at a substantially constant flow rate. Thus, it is clear from our findings that even if the flow velocity of the source gas is changed to deposit a film at a higher rate, the film deposited still can have its thickness uniformized. So there is no need to re-design the horizontal reactor each time the process conditions are changed.

In one embodiment of the present invention, the pressure of the source gas is preferably set within a range from about 0.01 atm and about 2 atm.

A second inventive film deposition method is also for use to deposit a semiconductor film on a wafer by making a source gas supplied flow almost horizontally to the surface of the wafer. The method includes the step of a) controlling the flow velocity and pressure of the source gas to find a first flow velocity and a first pressure that make such a combination as substantially uniformizing the thickness of the film deposited, and then determining a reference flow rate for the source gas. The reference flow rate should meet a predetermined relationship with the product of the first flow velocity and the first pressure. The method further includes the step of b) changing the first flow velocity and the first pressure into a second flow velocity and a second pressure with the reference flow rate kept constant. And the method further includes the step of c) supplying the source gas onto the wafer at the reference flow rate with the flow velocity and pressure of the source gas set equal to the second flow velocity and the second pressure, respectively, thereby depositing the film on the wafer.

According to the second inventive method, a first flow velocity and a first pressure of a source gas are changed into a second flow velocity and a second pressure with a reference flow rate kept constant. Then, the source gas is supplied onto a wafer at the reference flow rate with the flow velocity and pressure of the source gas set equal to the second flow velocity and the second pressure, respectively, to deposit a film on the wafer. Thus even if the flow velocity and pressure of the source gas have been changed, each film deposited can have its thickness uniformized. As a result, there is no need to re-design the horizontal reactor each time the process conditions are changed.

In one embodiment of the present invention, the first flow velocity is preferably determined in the step a) by setting an initial value of the first pressure to 1 atm or less. Specifically, it would be easier to find an optimum reference flow rate by setting an initial value of the first pressure to 1 atm or less and then changing the first flow velocity gradually to determine the best first flow velocity as compared to setting an initial value of the first pressure to more than 1 atm and then changing the first flow velocity gradually to determine the best first flow velocity.

Also, the first and second pressures are each preferably set within a range from about 0.01 atm and about 2 atm.

This invention also provides a method for fabricating a semiconductor device, including at least first and second semiconductor films stacked in this order on a wafer, by making at least first, second and third source gases supplied flow almost horizontally to the surface of the wafer. The method includes the step of a) controlling the flow velocity and pressure of the first source gas to find a first flow velocity and a first pressure that make such a combination as substantially uniformizing the thickness of each said film to be deposited, and then obtaining a reference flow rate for the first source gas. The reference flow rate meets a predetermined relationship with the product of the first flow velocity and the first pressure. The method further includes the step of b) setting a second flow velocity and a second pressure, which are different from the first flow velocity and the first pressure, respectively, for the second source gas with the reference flow rate kept constant. The second source gas has a viscosity substantially equal to that of the first source gas. The method further includes the step of c) supplying the second source gas onto the wafer at the reference flow rate with the flow velocity and pressure of the second source gas set equal to the second flow velocity and the second pressure, respectively, thereby depositing the first film on the wafer. The method further includes the step of d) setting a third flow velocity and a third pressure, which are different from the second flow velocity and the second pressure, respectively, for the third source gas with the reference flow rate kept constant. The third source gas has a viscosity substantially equal to that of the first source gas. The method further includes the step of e) supplying the third source gas onto the first film at the reference flow rate with the flow velocity and pressure of the third source gas set equal to the third flow velocity and the third pressure, respectively, thereby depositing the second film on the first film.

According to the present invention, first, a reference flow rate is determined for a first source gas. Next, with the reference flow rate kept constant, a second source gas is supplied at a second flow velocity and a second pressure to deposit a first film. Then, a third source gas is supplied at a third flow velocity and a third pressure to deposit a second film on the first film. Thus each of multiple films for a semiconductor device can have its thickness uniformized and its quality improved.

As used herein, the second or third source gas should "have a viscosity substantially equal to that of the first source gas" in the following two situations. One of the two situations is that even though the second or third source gas is made of a molecular species different from that of the first source gas, the second or third source gas has a viscosity substantially equal to that of the first source gas. In the other situation, the second or third source gas is also made of a different species from that of the first source gas and the first and second or third source gases are both diluted with a carrier gas in a huge quantity. In that case, the first and second or third source gases have their viscosities determined almost by the viscosity of the carrier gas itself.

In one embodiment of the present invention, the first and second films each preferably contain at least one Group III element and at least one Group V element. The second source gas preferably contains gallium and indium as Group III element sources and the second pressure set for the second source gas is preferably about 0.3 atm or more. The third source gas preferably contains gallium and aluminum as Group III element sources and the third pressure set for the third source gas is preferably about 1.0 atm or less. And the second pressure is preferably equal to or higher than the third pressure.

Also, the first, second and third pressures are each preferably set within a range from about 0.01 atm and about 2 atm.

The present invention further provides an apparatus for depositing a semiconductor film on a wafer by making a source gas supplied flow almost horizontally to the surface of the wafer. The apparatus includes: a reactor, in which the wafer is placed and which has a gas inlet port for supplying the source gas onto the wafer; velocity control means for controlling the flow velocity of the source gas; and pressure control means for controlling the pressure of the source gas in the reactor. In this apparatus, the velocity and pressure control means control the flow velocity and the pressure in such a manner as to keep the flow rate of the source gas near the gas inlet port substantially constant.

According to the inventive semiconductor film deposition apparatus, a film of a uniform thickness can be obtained even if the process conditions have been changed. Thus there is no need for re-designing the reactor every time the process conditions are changed.

BRIEF DESCRIPTION OF THE DRAWINGS

FIGS. 1A and 1B illustrate a situation where temperature, thickness of a film deposited and gas streamlines are substantially uniformly distributed in a semiconductor film deposition apparatus according to a first embodiment of the present invention:

FIG. 1A is a plan view illustrating the apparatus of the first embodiment; and FIG. 1B is a cross-sectional view thereof taken along the line IB—IB shown in FIG. 1A.

FIG. 2 is a plan view illustrating how the uniformity in the temperature, thickness and streamline distributions collapses in the apparatus of the first embodiment.

FIG. 5 is a plan view illustrating how the temperature, thickness and streamline distributions have restored its uniformity in the apparatus of the second embodiment.

FIGS. 7A and 7B are respectively a plan view, and a cross-sectional view taken along the line VIIB—VIIB shown in FIG. 7A, illustrating a known MOCVD reactor.

FIGS. 8A and 8B are respectively a plan view, and a cross-sectional view taken along the line VIIIB—VIIIB shown in FIG. 8A, illustrating another known MOCVD reactor.

FIGS. 9A and 9B are respectively a plan view and a side view illustrating still another known MOCVD reactor.

DESCRIPTION OF THE PREFERRED EMBODIMENTS

Embodiment 1

Figure 3:
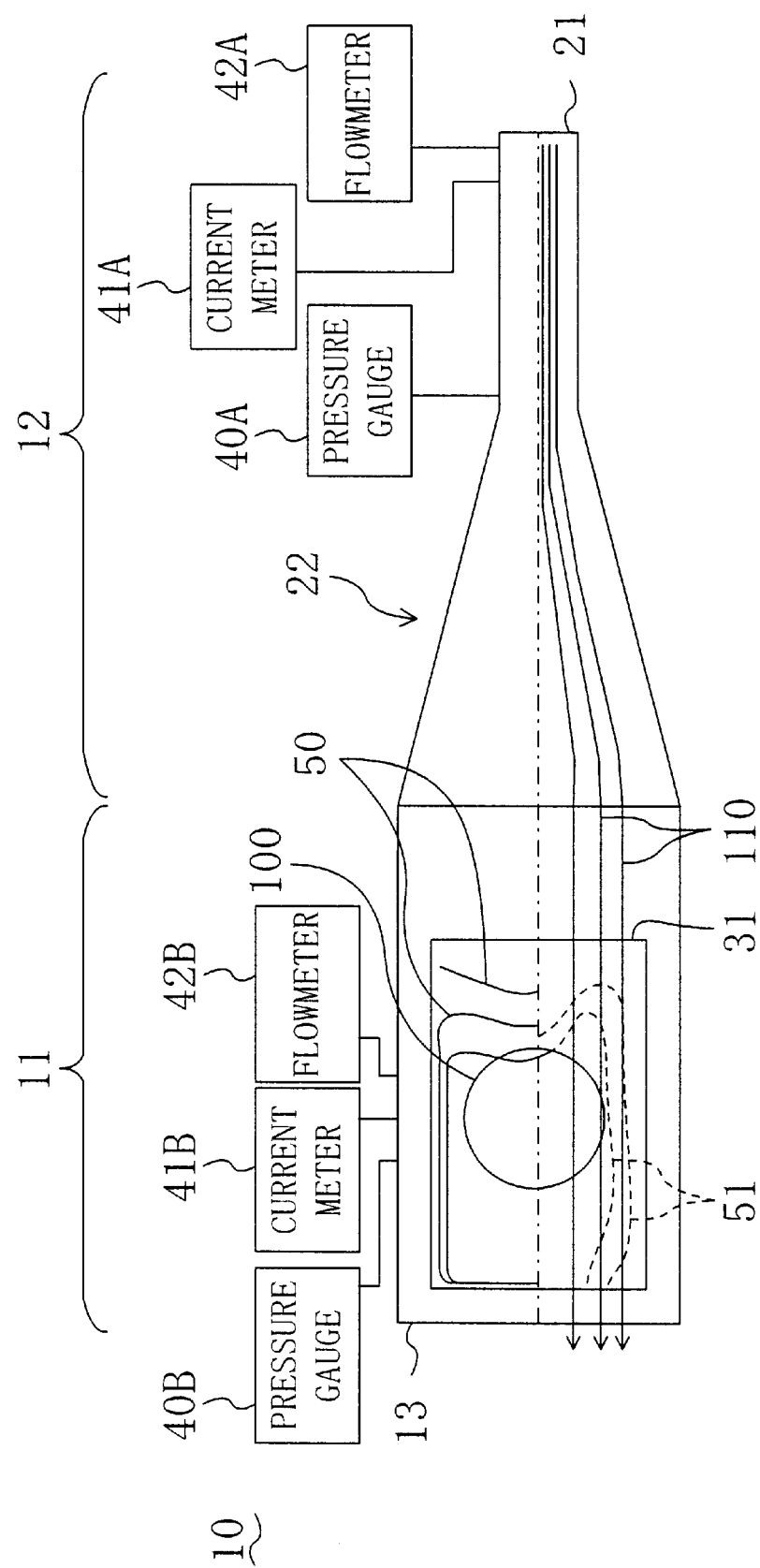
FIG. 3 is a plan view illustrating how the temperature, thickness and streamline distributions have restored its uniformity in the apparatus of the first embodiment.

Hereinafter, a first embodiment of the present invention will be described with reference to the accompanying drawings.

FIGS. 1A and 1B are respectively a plan view and a cross-sectional view, taken along the line IB—IB shown in FIG. 1A, illustrating a semiconductor film deposition apparatus (e.g., horizontal MOCVD reactor) according to the first embodiment.

As shown in FIGS. 1A and 1B, the horizontal reactor 10 includes: reactor body 11; gas inlet tube 12 with a gas inlet port 21; and susceptor 31 for holding a wafer 100 thereon and heating the wafer 100. The reactor body 11 and gas inlet tube 12 may be made of quartz glass and the susceptor 31 may be made of carbon, for example.

The reactor body 11 includes an opening at the bottom. The susceptor 31, whose bottom is heated by a heater (not shown), for example, is fitted in with the opening so that the wafer 100 is exposed inside the reactor body 11 and that the upper surface of the susceptor 31 is leveled with the bottom of the reactor body 11.

A gas outlet port 13 is provided at the other end of the reactor body 11 on the opposite side to the gas inlet tube 12.

The gas inlet tube 12 has the gas inlet port 21 with an opening width smaller than the width of the susceptor 31 as defined by the gas tube manufacturing standard. The gas inlet tube 12 supplies the source gases 101 onto the wafer 100 substantially horizontally to the wafer surface. The other end of the gas inlet tube 12 on the opposite side to the gas inlet port 21 is welded airtightly to the reactor body 11.

Also, the gas inlet tube 12 includes an expanded portion 22, in which the gap between the walls gradually increases from the gas inlet port 21 toward the susceptor 31. In the illustrated embodiment, the expansion angle a formed between each wall of the expanded portion 22 and the centerline running straight from the gas inlet port 21 toward the susceptor 31 is set to about 10 degrees.

Furthermore, a partition 23 for dividing the inner space of the gas inlet tube 12 into upper and lower channels 12a and 12b is also disposed inside the gas inlet tube 12.

In addition, the gas inlet tube 12 includes first pressure gauge 40A, first current meter 41A and first flowmeter 42A to respectively monitor the pressure of the source gases 101 inside the gas inlet tube 12 and the flow velocity and flow rate of the source gases 101 near the gas inlet port 21.

Similarly, the reactor body 11 includes second pressure gauge 40B, second current meter 41B and second flowmeter 42B to respectively monitor the pressure, flow velocity and flow rate of the source gases 101 that flow over the susceptor 31.

It should be noted that the pressure indicated by the first pressure gauge 40A is normally substantially equal to that indicated by the second pressure gauge 40B.

The first current meter 41A acts as a part of velocity control means and the second pressure gauge 40B acts as a part of pressure control means.

In the first embodiment, hydrogen gas and trimethylgallium (TMG) gas diluted with the hydrogen gas are supplied into the upper channel 12a to have a velocity of about 6 m/sec near the gas inlet port 21. Ammonia ($NH_3$) gas is supplied into the lower channel 12b to have a velocity of about 6 m/sec near the gas inlet port 21.

The source gases supplied separately into the upper and lower channels 12a and 12b combine with each other near the junction between the reactor body 11 and the gas inlet tube 12. The velocity of the confluent gas over the susceptor 31 is controlled at about 0.6 m/sec. Also, the internal pressure of the reactor body 11 is controlled at about 0.5 atm.

As shown in FIG. 1A, streamlines 110 are substantially uniformly distributed inside the reactor body 11. Also, the temperature distribution 50, thickness distribution 51 and velocity distribution of streamlines (not shown) 110 are substantially uniform spatially over the wafer 100 held on the susceptor 31.

In FIG. 1A, for the sake of simplicity, the temperature distribution 50, thickness distribution 51 and streamlines 100 are partially illustrated only on one side of the axis of symmetry running in the direction in which the source gases 101 flow. Actually, though, the same patterns are also formed symmetrically on the other side of the axis of symmetry. The same statement will be applicable to FIGS. 2, 3, 4 and 5.

Next, it will be described what if the internal pressure of the reactor body is increased from about 0.5 atm to about 2.0 atm with the velocity of the source gases 101 supplied through the gas inlet port 21 kept at about 6 m/sec near the gas inlet port 21 to improve the crystal quality of the film deposited on the wafer 100.

FIG. 2 illustrates the temperature distribution 50, thickness distribution 51 and streamlines 110 in the horizontal reactor 10 where only the gas pressure has been increased.

As shown in FIG. 2, a streamline 110, which has flowed along the inner wall surface of the gas inlet tube 12, separates at a point from the surface in a velocity boundary layer near the wall of the gas inlet tube 12. Then, the streamline 110 starts to flow downstream to create a vortex 110a.

If the vortex 110a is created, then the channel width of the gas flow is substantially decreased or the streamlines 110 are deformed. As a result, the velocity distribution of the gas flow with the streamlines 110 comes to show decreased spatial uniformity over the susceptor 31. Among other things, part of the gas flow showing the streamlines 110 around the axis of symmetry increases its velocity considerably in the reactor body 11. Thus, the gas temperature does not rise to reach a predetermined value, but a colder gas is supplied densely onto the center of the susceptor 31. Accordingly, the temperature distribution 50 and thickness distribution 51 shown in FIG. 2 have lost much of their uniformity over the center of the susceptor 31. As a result, it becomes difficult to keep the film thickness and quality uniform enough just as intended.

Furthermore, as described above, if the vortex 110a is created, the source gases get partially stuck inside the vortex 110a, thus adversely delaying the exchange of one source gas for another. In that case, even if the semiconductor film being deposited should have its composition changed, the interfacial profile cannot be steep enough.

To solve these problems, the first embodiment utilizes a proportionality found between the flow rate of a gas and its flow velocity and pressure. Specifically, in the example shown in FIG. 3, to equalize the resultant flow rate of the gases supplied through the gas inlet port 21 with the rate in the example shown in FIG. 1, the gas flow velocity near the gas inlet port 21 is decreased from about 6 m/sec to about 1.5 m/sec with the internal pressure of the reactor body 11 kept at about 2.0 atm.

As described above, the process conditions for the example shown in FIG. 1 include an internal pressure of about 0.5 atm for the reactor body 11 and a gas flow velocity of about 6 m/sec near the gas inlet port 21. On the other hand, the process conditions for the example shown in FIG. 3 include an internal pressure of about 2.0 atm for the reactor body 11 and a gas flow velocity of about 1.5 m/sec near the gas inlet port 21. In both cases, the product of the internal pressure and the gas flow velocity of the gas is about 3.0. In the first embodiment, this value is used as a reference flow rate.

To find an optimum reference flow rate, it is preferable to set an initial value of the internal pressure to 1 atm or less and then change the gas flow velocity gradually.

As shown in FIG. 3, the vortex 110a created in FIG. 2 has disappeared, so the temperature distribution 50, thickness distribution 51 and velocity distribution of the streamlines 110 are substantially uniform spatially over the wafer 100 held on the susceptor 31. Accordingly, a film of quality can be obtained for each wafer loaded as in the example illustrated in FIG. 1.

As can be seen, the quality of a film being deposited can be improved just as intended by changing the internal pressure and gas flow velocity in such a manner as to maintain a predetermined reference flow rate.

Embodiment 2

Hereinafter, a second embodiment of the present invention will be described with reference to the accompanying drawings.

In the second embodiment, the process conditions for the example shown in FIG. 1 are modified to improve the crystal quality and deposition rate of the resultant film. Specifically, it will be described what if the gas flow velocity near the gas inlet port 21 is increased from about 6 m/sec to about 24 m/sec with the internal pressure of the reactor body kept at about 0.5 atm.

Figure 4:
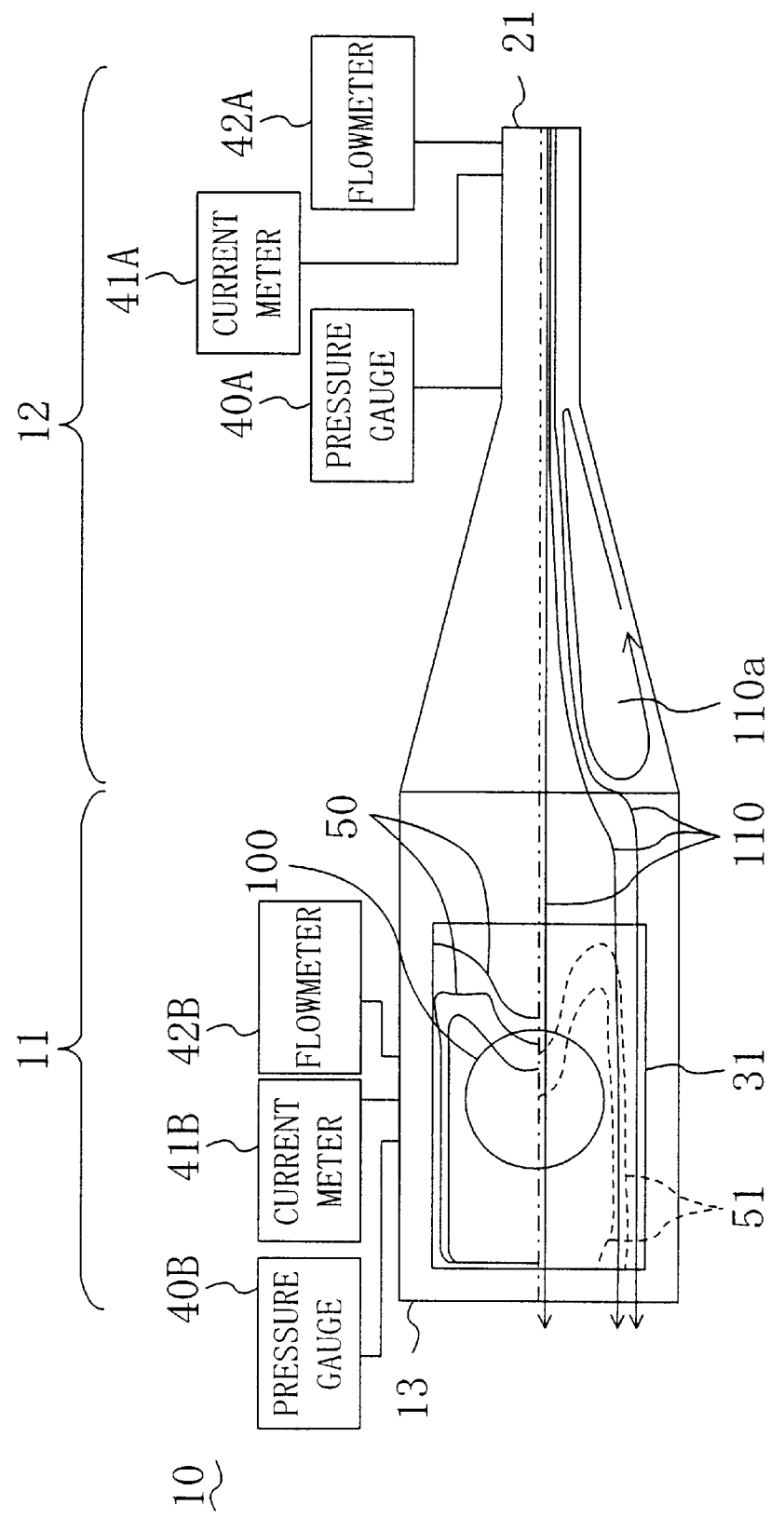
FIG. 4 is a plan view illustrating how the uniformity in the temperature, thickness and streamline distributions collapses in a semiconductor film deposition apparatus according to a second embodiment of the present invention.

FIG. 4 illustrates the temperature distribution 50, thickness distribution 51 and streamlines 110 in the horizontal reactor 10 where only the gas flow velocity has been increased.

As shown in FIG. 4, a streamline 110, which has flowed along the inner wall surface of the gas inlet tube 12, separates from the surface. Then, the streamline 110 starts to flow downstream to create a vortex 110a. If the vortex 110a is created, then the channel width of the gas flow is substantially decreased or the streamlines 110 are deformed. As a result, the velocity distribution of the gas flow with the streamlines 110 comes to show decreased spatial uniformity over the susceptor 31. Among other things, part of the gas flow showing the streamlines 110 around the axis of symmetry increases its velocity considerably in the reactor body 11. Thus, the gas temperature does not rise to reach a predetermined value, but a colder gas is supplied densely onto the center of the susceptor 31. Accordingly, the temperature distribution 50 and thickness distribution 51 shown in FIG. 4 have lost much of their uniformity over the center of the wafer 100. As a result, it becomes difficult to keep the film thickness and quality uniform enough just as intended.

The temperature distribution 50, thickness distribution 51 and streamlines 110 shown in FIG. 4 are substantially the same as those shown in FIG. 2 resulting from the process conditions including a gas flow velocity of about 6 m/sec and an internal pressure of about 2.0 atm.

Furthermore, as described above, if the vortex 110a is created, the source gases get partially stuck inside the vortex 110a, thus adversely delaying the exchange of one source gas for another. In that case, even if the semiconductor film being deposited should have its composition changed, the interfacial profile cannot be steep enough.

In view of these problems, the internal pressure of the reactor body 11 is decreased from about 0.5 atm to about 0.125 atm with the gas flow velocity near the gas inlet port 21 kept at about 24 m/sec to equalize the flow rate of the gases supplied through the gas inlet port 21 with the reference flow rate of about 3.0 determined for the example shown in FIG. 1.

Then, as shown in FIG. 5, the vortex 110a created in FIG. 4 has disappeared, and the temperature distribution 50, thickness distribution 51 and velocity distribution of the streamlines 110 are substantially uniform spatially over the wafer 100 held on the susceptor 31. Accordingly, a film of quality can be obtained for each wafer loaded as in the example illustrated in FIG. 1 or 3.

As described above, according to the first or second embodiment, if a reference flow rate is determined in advance in such a manner as to uniformize a film thickness and then process conditions are changed to obtain a more preferable internal pressure, the flow velocity of a gas is controlled so that the reference flow rate is kept constant. In this manner, the thickness of the film deposited can be kept uniform.

Also, if the process conditions are changed to obtain a more preferable gas flow velocity, the thickness of the film deposited can also be kept uniform by controlling the internal pressure so that the reference flow rate is kept constant. In this case, the internal pressure is preferably set within a range from about 0.01 atm and about 2 atm.

In addition, the semiconductor films to be deposited do not have to be made of Group III-V compounds but may be made of Group II-VI compounds.

Embodiment 3

Hereinafter, a third embodiment of the present invention will be described with reference to the accompanying drawings.

For the first and second embodiments, where process conditions for depositing a film on a wafer should be changed to deposit another film on another wafer, the flow velocity and pressure of source gases are supposed to be controlled in such a range as to keep a reference flow rate unchanged.

In the third embodiment, it will be described how to deposit at least two films with mutually different compositions on a wafer with the process conditions changed in accordance with the compositions of those films.

Figure 6A:
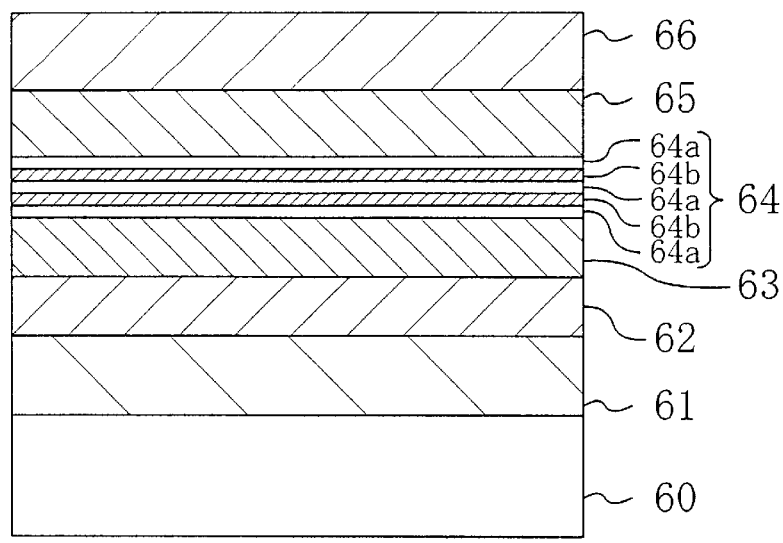
FIG. 6A and 6B are cross-sectional views corresponding to respective process steps for fabricating a semiconductor laser diode made of Group III-V nitride semiconductors according to a third embodiment of the present invention.
Figure 6B:
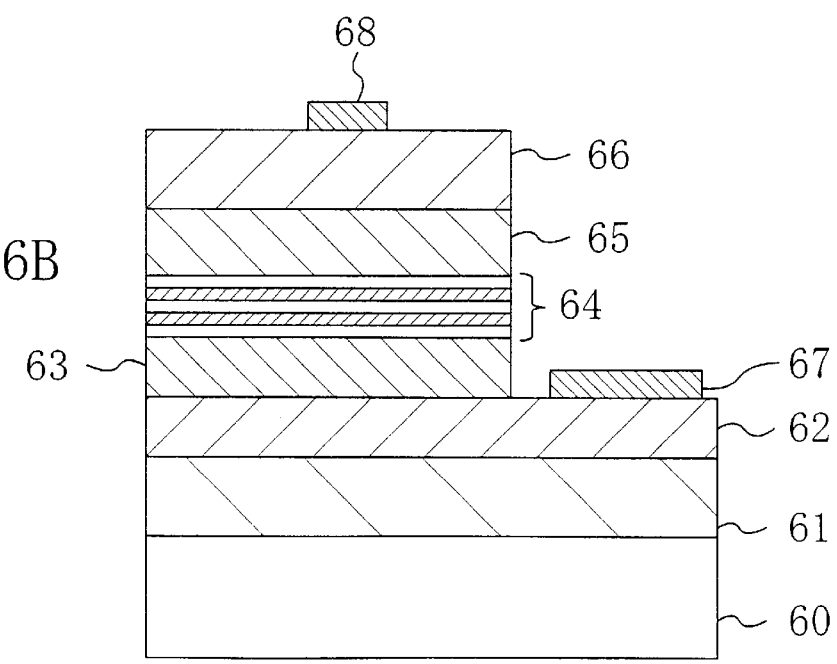

FIG. 6A and 6B illustrate cross-sectional structures corresponding to respective process steps for fabricating a violet-light-emitting semiconductor laser diode made of Group III-V nitride semiconductors according to the third embodiment.

First, as shown in FIG. 6A, a wafer 60, made of sapphire, for example, is held on the susceptor 31 of the horizontal reactor 10 shown in FIG. 1. Then, buffer layer 61 of gallium nitride (GaN), n-type contact layer 62 of GaN, n-type cladding layer 63 of aluminum gallium nitride (AlGaN), multi-quantum well (MQW) active layer 64, p-type cladding layer 65 of AlGaN, and p-type contact layer 66 of GaN are stacked in this order on the wafer 60. The MQW active layer 64 is formed by alternately stacking multiple barrier layers 64a and multiple well layers 64b made of AlGaN and indium gallium nitride (InGaN), respectively.

In depositing the buffer layer 61 and n- and p-type contact layers 62 and 66, TMG gas diluted with nitrogen ($N_2$) gas is supplied as a Group III source into the upper channel to have a velocity of about 6 m/sec near the gas inlet port and $NH_3$ gas is supplied as a Group V source into the lower channel to have a velocity of about 6 m/sec near the gas inlet port. The internal pressure inside the reactor body is controlled at about 0.4 atm.

In depositing the n- and p-type cladding layers 63 and 65 and barrier layers 64a containing aluminum (Al), TMG and trimethylaluminum (TMA) gases diluted with $N_2$ gas are used as Group III sources and $NH_3$ gas is used as a Group V source. The velocity of each of these gases near the gas inlet port is controlled at about 6 m/sec. The internal pressure inside the reactor body is controlled at about 0.4 atm.

In depositing the well layers 64b containing indium (In), TMG and trimethylindium (TMI) gases diluted with $N_2$ gas are used as Group III sources and $NH_3$ gas is used as a Group V source. Since In has a high vapor pressure, the internal pressure should be set higher compared to depositing a film containing no In. The flow velocity of each of these gases near the gas inlet port is controlled at about 2 m/sec and the internal pressure of the reactor body is controlled at about 1.2 atm to keep a reference flow rate, which is proportional to the product of the gas flow velocity and the internal pressure of the reactor body, unchanged. In this embodiment, the reference flow rate is 2.4 (=6 (m/s)×0.4 (atm)).

Next, as shown in FIG. 6B, the p-type contact layer 66, p-type cladding layer 65, MQW active layer 64 and n-type cladding layer 63 are selectively dry-etched to expose the n-type contact layer 62. And an n-side electrode 67 is formed as a stack of titanium (Ti) and aluminum (Al) films on the exposed surface of the n-type contact layer 62. Then, a ridged p-side electrode 68 is formed as a stack of nickel (Ni) and gold (Au) films on the p-type contact layer 66b. The n- and p-side electrodes 67 and 68 may be formed in reverse order.

In fabricating a semiconductor laser diode including semiconductor layers with mutually different compositions, the flow velocity or pressure of source gases is changed in accordance with the composition of each of those layers so that the reference flow rate of the source gases is kept constant. In this manner, each film deposited can have its thickness kept spatially uniform and can also have its quality improved.

If the barrier layers 64a should be made of gallium nitride, trimethylgallium gas diluted with $N_2$ gas and $NH_3$ gas may be supplied in such a manner as to have a velocity of about 6 m/sec near the gas inlet port and an internal pressure of about 0.4 atm in the reactor body. Then, a film of quality can also be obtained.

In addition, the resonant cavity structure of the semiconductor laser diode according to the third embodiment is just an example, so the MQW active layer 64 may have a single quantum well structure including a single well layer 64b.

Further, the MQW active layer 64 may be sandwiched between n- and p-type light guides, or may include an optical guiding layer.

Furthermore, a semiconductor device to be fabricated does not have to be a semiconductor laser diode but may be a light-emitting diode, for example.

What is claimed is:

1. A method for depositing a semiconductor film on a wafer by making a source gas supplied flow almost horizontally to the surface of the wafer, the method comprising the steps of:

a) controlling the flow velocity and pressure of the source gas to find a first flow velocity and a first pressure that make such a combination as substantially uniformizing the thickness of the film deposited, and then determining a reference flow rate, which meets a predetermined relationship with the product of the first flow velocity and the first pressure, for the source gas;

b) changing the first flow velocity and the first pressure into a second flow velocity and a second pressure with the reference flow rate kept constant; and c) supplying the source gas onto the wafer at the reference flow rate with the flow velocity and pressure of the source gas set equal to the second flow velocity and the second pressure, respectively, thereby depositing the film on the wafer.

2. The method of claim 1, wherein in the step a), the first flow velocity is determined by setting an initial value of the first pressure to 1 atm or less.

3. The method of claim 1, wherein the first and second pressures are each set within a range from about 0.01 atm and about 2 atm.

4. A method for fabricating a semiconductor device, including at least first and second semiconductor films stacked in this order on a wafer, by making at least first, second and third source gases supplied flow almost horizontally to the surface of the wafer, the method comprising the steps of:

a) controlling the flow velocity and pressure of the first source gas to find a first flow velocity and a first pressure that make such a combination as substantially uniformizing the thickness of each said film to be deposited, and then determining a reference flow rate, which meets a predetermined relationship with the product of the first flow velocity and the first pressure, for the first source gas;

b) setting a second flow velocity and a second pressure, which are different from the first flow velocity and the first pressure, respectively, for the second source gas with the reference flow rate kept constant, the second source gas having a viscosity substantially equal to that of the first source gas;

c) supplying the second source gas onto the wafer at the reference flow rate with the flow velocity and pressure of the second source gas set equal to the second flow velocity and the second pressure, respectively, thereby depositing the first film on the wafer;

d) setting a third flow velocity and a third pressure, which are different from the second flow velocity and the second pressure, respectively, for the third source gas with the reference flow rate kept constant, the third source gas having a viscosity substantially equal to that of the first source gas; and e) supplying the third source gas onto the first film at the reference flow rate with the flow velocity and pressure of the third source gas set equal to the third flow velocity and the third pressure, respectively, thereby depositing the second film on the first film.

5. The method of claim 4, wherein the first and second films each contain at least one Group III element and at least one Group V element and wherein the second source gas contains gallium and indium as Group III element sources and the second pressure set for the second source gas is about 0.3 atm or more, and wherein the third source gas contains gallium and aluminum as Group III element sources and the third pressure set for the third source gas is about 1.0 atm or less, and wherein the second pressure is equal to or higher than the third pressure.

6. The method of claim 4, wherein the first, second and third pressures are each set within a range from about 0.01 atm and about 2 atm.

7. The method of claim 1, wherein said reference flow rate is 3 atm·m/s.

8. The method of claim 4, wherein said reference flow rate is 2.4 atm·m/s.

* * * * *